United States Patent
Arioka

(10) Patent No.: US 6,592,936 B2
(45) Date of Patent: *Jul. 15, 2003

(54) SPIN COATING METHOD AND COATING APPARATUS

(75) Inventor: Hiroyuki Arioka, Nagano (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/508,520

(22) PCT Filed: Sep. 25, 1998

(86) PCT No.: PCT/JP98/04285
§ 371 (c)(1),
(2), (4) Date: Mar. 27, 2000

(87) PCT Pub. No.: WO99/16554
PCT Pub. Date: Apr. 8, 1999

(65) Prior Publication Data
US 2002/0037366 A1 Mar. 28, 2002

(30) Foreign Application Priority Data
Sep. 27, 1997 (JP) .............................. 9-279650

(51) Int. Cl.[7] .................................................. B05D 3/12
(52) U.S. Cl. ...................... 427/162; 427/240; 427/425; 118/52; 118/320
(58) Field of Search ............................... 427/240, 425, 427/162; 118/52, 320

(56) References Cited

U.S. PATENT DOCUMENTS

| | | | | |
|---|---|---|---|---|
| 4,416,213 A | * | 11/1983 | Sakiya | 118/52 |
| 4,451,507 A | * | 5/1984 | Beltz et al. | 427/240 |
| 5,853,812 A | * | 12/1998 | Kawasaki et al. | 427/421 |
| 6,162,507 A | * | 12/2000 | Hayes et al. | 427/425 |
| 6,238,107 B1 | * | 5/2001 | Inada | 396/604 |

FOREIGN PATENT DOCUMENTS

| | | |
|---|---|---|
| JP | 63240966 A | 10/1988 |
| JP | 01030671 A | 2/1989 |
| JP | 06318543 A | 11/1994 |
| JP | 06339657 A | 12/1994 |
| JP | 07321029 A | 12/1995 |
| JP | 08168714 A | 7/1996 |
| JP | 10-178008 | * 6/1998 |

OTHER PUBLICATIONS

Hosokawa, JP 10–178008, Jun. 30, 1998, computer translation of patent—claims and detailed description sections.*

* cited by examiner

Primary Examiner—Shrive P. Beck
Assistant Examiner—Kirsten Crockford Jolley
(74) Attorney, Agent, or Firm—Rader, Fishman & Grauer PLLC

(57) ABSTRACT

There are provided a spin coating method and an apparatus for forming a thin film having a uniform thickness on a substrate at a low cost in a process for manufacturing semiconductors, optical disks and the like. A coating solution is dropped onto the surface of a substrate (2) to be coated, mounted on a horizontal turn table (3) through a discharge nozzle (4) and the substrate is turned to form a thin film. After the coating solution is dropped through the nozzle, a stand-by nozzle tip (4a) is soaked and held in a nozzle soaking solution (10) having a composition near or equivalent to that of the coating solution. The crystal deposition of the solute is suppressed. Inter alia, the present invention is useful when a solution containing a solute having high crystallizability is coated.

4 Claims, 1 Drawing Sheet

SPIN COATING METHOD AND COATING APPARATUS

TECHNICAL FIELD

The present invention relates to a spin coating method and a coating apparatus for forming a thin film having a uniform thickness on a substrate in a process for manufacturing, for example, semiconductors, optical disks and the like.

TECHNICAL BACKGROUND

The techniques for forming a thin film having a uniform thickness on a substrate is very important in various fields. For example, upon coating a resist or a reflection preventing solution on a wafer in a semiconductor manufacturing process, or upon coating a light-absorbing dye solution etc. on a disk in an optical disk manufacturing process, it is very important that these chemical solutions are coated uniformly to form a thin film having a uniform thickness.

As a method for forming a thin film having a uniform thickness, one example thereof is a spin coating method. This method is a method in which a coating solution is dropped from a nozzle onto a substrate in the stationary or turning state and, thereafter, this substrate is turned at a high speed to remove the unnecessary solution to form a thin film having a uniform thickness on the substrate surface.

According to this spin coating method, during waiting in a nozzle after dropping a coating solution from a nozzle and until dropping again the coating solution next time, since a tip of the nozzle contacts with an outer air, a part of a solvent in the coating solution evaporates and the composition of the coating solution contained in the nozzle tip is changed. This causes a problem that the ununiformity of the thin film thickness occurs upon forming a thin film.

In particular, when a solute having high crystallizability such as dye and the like is contained in the coating solution, during waiting in the nozzle, crystals are deposited at the nozzle tip and the crystals are fallen on the substrate together with the coating solution upon dropping the solution, leading to defects derived from the crystals in some cases.

In order to suppress this, the provision of a washing mechanism at the nozzle tip is generally carried out. However, this not only makes an apparatus large scale but also the use of a solvent as a washing solution changes the concentration of the coating solution because of the remaining solvent at the nozzle tip, which also leads to the ununiform thin film thickness.

When a solution having a composition near to that of the coating solution containing a solute is used as a washing solution, the aforementioned disadvantage in the case of the solvent alone is avoided but, where the cost of the coating solution used is high, the use of a large amount of the washing solution leads to the cost-up, resulting in not practical use.

In addition, for example, a method is disclosed in JP-A-8-168714, in which an initial portion of a coating solution which has been dropped is recovered and only the solution thereafter is dropped onto a substrate. According to this method, when a solute having high crystallizability is contained in a coating solution, the deposited crystals are removed to a some degree but this is still not complete. In addition, like the nozzle washing method as described above, since a part of the coating solution is lost, the cost-up is caused.

Further, for example, there is described the change in the shape of a nozzle tip and prevention of solution falling from the nozzle tip therefrom in JP-A-7-321029. However, the change in the shape of the nozzle tip dose not prevent the crystals from deposition.

DISCLOSURE OF THE INVENTION

OBJECTS OF THE INVENTION

Therefore, an object of the present invention is to overcome the problems of the prior art and provide a spin coating method and a coating apparatus for forming a thin film having a uniform thickness on a substrate, at a low cost, in a process for manufacturing, for example, semiconductors, optical disks and the like.

Inter alia, an object of the present invention is to provide a spin coating method and an apparatus for forming a thin film having a uniform thickness on a substrate, at a low cost, without the deposition of crystals at a nozzle tip, even when a solution containing a solute having high crystallizability is coated.

SUMMARY OF THE INVENTION

The present inventor intensively studied a method which can suppress the deposition of crystals at a nozzle tip even when a solution containing a solute having high crystallizability is coated.

First, it is contemplated that a nozzle tip is dipped in the same solvent as that of a coating solution during waiting in the nozzle. However, in this method, a solvent is attached to the nozzle tip, the concentration of the coating solution immediately after initiation of dropping changes and, for this reason, the coating nonuniformity occurs in some cases.

The present inventor found that, in order to solve this, it is effective to soak the nozzle tip in a solution having a composition near that of a coating solution in waiting in a nozzle, which resulted in the completion of the present invention.

That is, the present invention is a spin coating method for forming a thin film on the surface of a substrate by dropping a coating solution containing at least one solute and a solvent from a discharge nozzle onto the surface of a substrate to be coated, mounted on a horizontal turn table and turning the substrate, said method comprising soaking and holding a nozzle tip in a nozzle soaking solution containing at least one of said solute and the same solvent as said solvent or a solvent having a similar chemical structure to that of said solvent, after the coating solution is dropped from the nozzle.

In the present invention, it is preferred that the nozzle soaking solution is a solution containing at least one of said solute and the same solvent as said solvent.

In the present invention, it is preferred that the nozzle soaking solution is a solution having a composition near that of the coating solution.

In the present invention, it is preferred that the nozzle soaking solution contains a main component of the solute of the coating solution, and the concentration of the main component in the nozzle soaking solution is 10 to 200% relative to the main component concentration in the coating solution.

In the present invention, it is preferred that the nozzle soaking solution contains all the components of the solute of the coating solution, and the concentration of each of these components in the nozzle soaking solution is respectively 10 to 200% relative to the concentration of each component in the coating solution.

In the present invention, the nozzle soaking solution is a solution having the same composition as that of the coating solution.

In addition, the present invention is a spin coating apparatus comprising a horizontal turn table on which a substrate to be coated is mounted and which turns the substrate and a discharge nozzle for dropping a coating solution onto the surface of a substrate, said apparatus comprising a nozzle soaking means for soaking and holding a nozzle tip after dropping of the coating solution in a nozzle soaking solution.

DETAILED DESCRIPTION OF THE INVENTION

Figure 1:
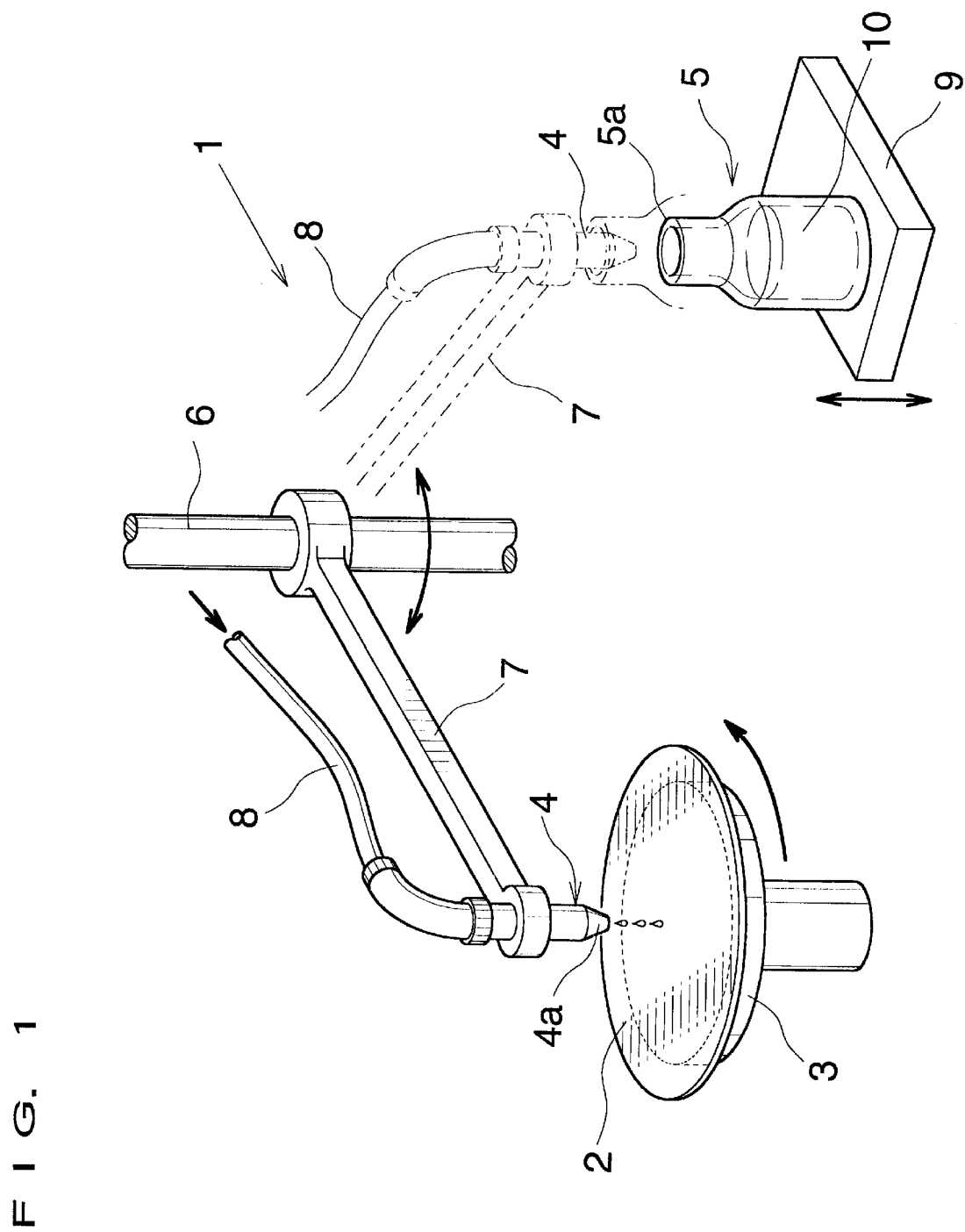
FIG. 1 is a view showing a schematic construction of one embodiment of a spin coating apparatus for carrying out a method of the present invention.

In the present spin coating method, after a coating solution is dropped from a nozzle, a stand-by nozzle tip is soaked and held in a nozzle soaking solution containing at least one solute contained in the coating solution and the same solvent as solvent of the coating solution or a solvent having a similar chemical structure to that of solvent of the coating solution.

Like this, by soaking and holding a stand-by nozzle tip in a nozzle soaking solution containing at least one solute contained in the coating solution and the same solvent as solvent of the coating solution or a solvent having a similar chemical structure to that of solvent of the coating solution, the crystal deposition of the solute at the nozzle tip can be suppressed. In addition, even when a nozzle is used while the nozzle soaking solution remains attached to the nozzle tip, the change in the composition and the concentration of the coating solution after initiation of re-dropping is very small and the occurrence of the coating nonuniformity on a substrate can be suppressed. Therefore, the occurrence of the coating nonuniformity caused when a nozzle tip is soaked and held in a solvent alone becomes very small.

As used herein, "a solvent having a similar chemical structure to that of solvent of a coating solution" means a solvent which is a homologue of a solvent of the coating solution and is similar in the chemical and physical properties. Examples thereof are methoxyethanol relative to ethoxyethanol, and diethyl ketone relative to methyl ethyl ketone. However, in the present method, it is preferred that the nozzle soaking solution is a solution containing at least one of said solute and the same solvent as said solvent.

In the present method, it is preferred that the nozzle soaking solution is a solution having a composition near that of the coating solution because the change in the composition and the concentration of the coating solution after initiation of re-dropping can be suppressed to smaller. In this case, the occurrence of coating nonuniformity on a substrate can be suppressed to a greater degree.

"A solution having a composition near that of a coating solution" is, for example, a solution which contains a main component of solutes of the coating solution, and the concentration of the main component in a nozzle soaking solution is around 10 to 200% relative to the concentration of the main component in the coating solution. By using the nozzle soaking solution having a range of such the relative concentration, the change in the composition and the concentration of the coating solution after initiation of re-dropping can be smaller. The more preferable range of the relative concentration is around 50 to 150%.

In addition, by using a solution which contains all the components of solutes of the coating solution and the concentration of each component in the nozzle soaking solution is 10 to 200% relative to the concentration of each component in the coating solution, respectively, the change in the composition and the concentration of the coating solution after initiation of re-dropping can be more smaller, it being more preferable. In this case, the more preferable range of the relative concentration of each component is around 50 to 150%.

In the present method, in the particularly more preferable case, as the nozzle soaking solution, a solution having the same composition as that of the coating solution. That is, by using the same solution as the coating solution as a nozzle soaking solution, the change in the composition and the concentration of the coating solution after initiation of re-dropping can be substantially zero. Therefore, in this case, the occurrence of the coating nonuniformity on a substrate can be suppressed to minimum.

The present method can inhibit the crystal deposition at a nozzle tip even when a coating solution contains as a main components of solutes a light-absorbing dye having high crystallizability. Therefore, for example, when a solution containing a light-absorbing dye having high crystallizability for forming a recording layer of an optical disk etc. is coated, the present method is suitable used.

Such the light-absorbing dye having high crystallizability for forming a recording layer etc. is described in more detail. A light-absorbing dye for forming a recording layer is not limited to specified ones as long as it has maximum absorption of 600 to 900 nm, preferably 600 to 800 nm, more preferably 650 to 750 nm and one or two or more can be appropriately selected from cyanine, phthalocyanine, naphthalocyanine, anthraquinone, azo, triphenylmethane, pyrylium or thiapyrylium salt, squarylium, croconium, formazan, metal complex dye and the like.

As the cyanine dye, cyanine dyes having indolenine ring which may have an aromatic fused ring, particularly benzoindolenine ring, are preferable. In addition, it is preferred that the indolenine rings are bonded via a pentamethine chain.

In addition, the present method is suitable used for coating a solution wherein a singlet oxygen quencher is mixed in a light-absorbing dye. Further, the present method can be applied to coating of a solution containing a light-absorbing dye of a dye cation and a singlet oxygen quencher anion which are tonically conjugated.

As such the quencher, mention may be made of metal complexes such as acetylacetonato, bisdithiol such as bisdithio-α-diketone and bisphenyldithiol, thiocatechol, salicylaldehydeoxime, metal complex such as thiobisphenolate and the like. In addition, amine quenchers such as amine compounds having a nitrogen radical cation, hindered amines and the like are also suitable.

While a cyanine dye having indolenine ring is preferable as a dye which constitutes a conjugate, a metal complex dye such as bisphenyldithiol metal complex and the like is preferable as a quencher.

When a solution containing the aforementioned dye is coated, the present method is suitably used.

Then, a spin coating apparatus for carrying out the aforementioned present method is illustrated with reference to a drawing.

FIG. 1 is a view showing the schematic construction of one embodiment of the present spin coating apparatus. In FIG. 1, the spin coating apparatus (1) comprises a horizontal turn table (3) on which a substrate (2) to be coated is mounted and which turns the substrate, a discharge nozzle (4) for dropping a coating solution on the surface of a substrate (2), and a nozzle soaking container (5) in which predetermined amount of nozzle soaking solution (10) is placed. The discharge nozzle (4) is attached to a horizontal arm (7) fixed to a vertical rotating axis (6) which reversibly rotates and adapted to rotate in a horizontal direction simultaneously with the rotation of the vertical rotating axis (6). In addition, a coating solution is fed to the discharge nozzle (4) via a coating solution supplying tube (8) and the coating solution is dropped from a nozzle tip (4a). On the other hand, the nozzle soaking container (5) is mounted on a container bed (9) which moves up and down so as to soak the nozzle tip (4a) in the soaking solution (10).

In the present invention, first, a predetermined amount of a coating solution is dropped through the discharge nozzle tip (4a) onto the surface of a substrate (2) to be coated, mounted on the horizontal turn table (3). The substrate (2) may be either stationary state or the turning state. Then, this substrate (2) is turned at a high speed to remove the unnecessary solution to form a thin film having a uniform thickness on the substrate surface and at the same time rotate the vertical rotating axis (6) in a counterclockwise direction (in FIG. 1), to move the nozzle tip (4a) towards a position above an opening (5a) of the soaking container (shown by a broken line in FIG. 1). And, the nozzle soaking container (5) is elevated to such a height that the nozzle tip (4a) is soaked in the soaking solution (10). It is good that around 5 to 15 mm of the nozzle tip (4a) is soaked in the solution (10). After the completion of thin film forming work of the substrate (2), the nozzle soaking container (5) is lowered to the original height and the vertical rotating axis (6) is rotated to the dropping position in a clockwise direction to drop again a coating solution through the discharge nozzle tip (4a) onto the surface of a substrate (2) to be coated next. Like this, the stand-by nozzle tip (4a) is soaked and held in the soaking solution (10).

The apparatus shown in FIG. 1 is one example of the present spin coating apparatuses and various modifications are possible depending upon purposes of the present invention. For example, the following is possible: The discharge nozzle (4) is usually fixed to the dropping position, the nozzle soaking container (5) is made possible to move in both horizontal and vertical directions and, after dropping of the coating solution through the nozzle tip (4a), the nozzle soaking container (5) is moved to a position below the nozzle tip (4a) and, subsequently, elevated so as to soak and hold the tip (4a) in the soaking solution (10).

In addition, it is preferred that the soaking container (5) has an opening (5a) of a small area in order to avoid the change in the concentration caused by evaporation of a solvent in the soaking solution.

According to the present spin coating method, since after dropping of the coating solution through the nozzle, the stand-by nozzle tip is soaked and held in the soaking solution containing at least one of solutes contained in the coating solution and the same solvent as solvent of the coating solution or a solvent having a similar chemical structure to that of solvent of the coating solution, the crystal deposition of this solute at the nozzle tip can be suppressed and at the same time the occurrence of the coating nonuniformity on the substrate can be suppressed because the change in the composition and the concentration of the coating solution after initiation of re-dropping is very small even when the nozzle is used while the nozzle soaking solution is attached to the nozzle tip.

According to the present method, even when solutes and solvents contained in a coating solution is high-cost, since an amount of the nozzle soaking solution used is small, which dose not lead to the increase in cost.

In addition, according to the present spin coating apparatus, the aforementioned present method can be carried out.

MODE FOR CARRYING OUT THE INVENTION

The present invention is described in more detail by ways of Examples but is not limited to Examples.

EXAMPLE 1

A step of coating a dye solution on a CD-R optical disk was performed using an apparatus shown in FIG. 1. As a soaking container (5), a container having an opening diameter of 15 mm and a volume of 10 cc was used. In addition, 8 cc of a soaking solution (10) is placed in the container (5) and a stand-by nozzle tip (4a) was set to be soaked in the solution such a degree that 5 mm or more of the tip was in the solution.

As a coating solution, a solution having the following

| | |
|---|---|
| Solvent: Ethoxyethanol | 95 parts by weight |
| Solute: Cyanine dye of the chemical formula (A) | 4 parts by weight |
| Metal complex quencher of the chemical formula (B) | 1 part by weight |

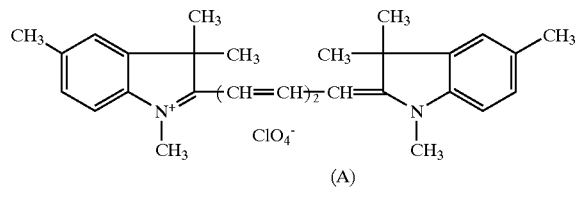

(A)

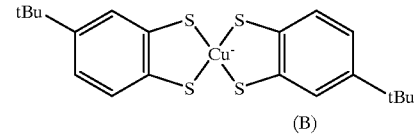

(B)

As a soaking solution (10), a solution having the same composition as the above coating solution was used.

Under such the conditions, a step of coating a dye solution on a polycarbonate resin substrate (2), 120 mm in diameter and 1.2 mm in thickness, having spiral grooves was performed to manufacture 10 disks with a recording layer having the thickness of 200 nm.

After a predetermined amount of a coating solution was dropped through discharge nozzle tip (4a) onto a substrate (2) mounted stationarily on a horizontal turn table (3), this substrate (2) was turned at a high speed to remove the unnecessary solution. In addition, after dropping of the coating solution, a vertical rotating axis (6) was rotated in a counterclockwise direction to move the nozzle tip (4a) to a position above an opening (5a) of the soaking container, and the nozzle soaking container (5) was elevated to soak the nozzle tip (4a) in the soaking solution (10) to a degree of 5 mm or more and hold for 5 seconds.

After the completion of thin film forming of this substrate (2), the nozzle soaking container (5) was lowered to rotate the vertical rotating axis (6) to a dropping position in a clockwise direction. And then, the coating solution was dropped onto a next substrate to be coated again though discharge nozzle tip (4a).

This series of procedures were repeated to manufacture to 10 disks with a recording layer having the thickness of 200 nm.

Subsequently, regarding each disk, a reflection layer was formed by a sputtering method. The thickness and the composition of the reflection layer were as follows:

Reflection layer (80 nm): Au

Then, a protecting coating was formed on the reflection layer. The protecting coating was formed by coating an ultraviolet curing-type resin (manufactured by Dainippon Ink & Chemicals, Inc., SD-318) by a spin coating method, and performing ultraviolet-curing. The thickness of the protecting coating after curing was 5 $\mu$m.

Regarding each of 10 disk samples thus obtained, recording was performed with a CD-R recording machine: 920S (manufactured by Sony Corporation) and block error rate (BLER) was measured with a CD measuring machine: CD-CATS (manufactured by Audio Development). BLER was measured about an inner circumferential part for 10 minutes to obtain an average number (Count/Sec) per 1 second. The measurement results are shown in Table 1. Incidentally, acceding to Orange book which prescribes the specification of CD-R, it is required that BLER be less than 220 Count/Sec.

EXAMPLE 2–5, COMPARATIVE EXAMPLES 1–2

According to the same manner as that in Example 1 except that a soaking solution having the following composition was used instead of the soaking solution in Example 1, 10 disk samples were manufactured, respectively, and Block error rate (BLER) was measured.

EXAMPLE 2

| | |
|---|---|
| Solvent: Ethoxyethanol | 96 parts by weight |
| Solute: Cyanine dye of the chemical formula (A) | 14 parts by weight |

EXAMPLE 3

| | |
|---|---|
| Solvent: Ethoxyethanol | 98 parts by weight |
| Solute: Cyanine dye of the chemical formula (A) | 2 parts by weight |

EXAMPLE 4

| | |
|---|---|
| Solvent: Ethoxyethanol | 93 parts by weight |
| Solute: Cyanine dye of the chemical formula (A) | 5 parts by weight |
| Metal complex quencher of the chemical formula (B) | 2 parts by weight |

EXAMPLE 5

| | |
|---|---|
| Solvent: Methoxyethanol | 96 parts by weight |
| Solute: Cyanine dye of the chemical formula (A) | 4 parts by weight |

EXAMPLE 6

| | |
|---|---|
| Solvent: Ethoxyethanol | 99 parts by weight |
| Solute: Cyanine dye of the chemical formula (A) | 1 part by weight |

COMPARATIVE EXAMPLE 1

| | |
|---|---|
| Solvent: Ethoxyethanol | 100 by weight |

COMPARATIVE EXAMPLE 2

Nothing was place in a soaking container (5).

The above results are summarized in Table 1.

TABLE 1

The BLER measurement results

| | Number (Count/Sec) | | | | | | | | |
|---|---|---|---|---|---|---|---|---|---|
| Example 1 | 5 | 3 | 3 | 8 | 5 | 6 | 4 | 5 | 4 | 5 |
| Example 2 | 9 | 15 | 10 | 17 | 5 | 5 | 11 | 18 | 15 | 11 |
| Example 3 | 73 | 41 | 45 | 46 | 58 | 46 | 43 | 70 | 88 | 53 |
| Example 4 | 4 | 10 | 10 | 9 | 6 | 7 | 8 | 9 | 11 | 8 |
| Example 5 | 63 | 60 | 58 | 31 | 48 | 42 | 56 | 39 | 24 | 49 |
| Example 6 | 135 | 148 | 173 | 184 | 161 | 158 | 150 | 198 | 173 | 150 |
| Comparative Example 1 | 580 | 634 | 501 | 486 | 473 | 409 | 541 | 698 | 670 | 521 |
| Comparative Example 2 | 1963 | 2326 | 1811 | 2459 | 2118 | 2104 | 2394 | 2047 | 2254 | 2230 |

From Table 1, all the Examples 1–6 in accordance with the present invention show the sufficient practical use, even the worst BLER disk being less than 220 Count/Sec. Inter alia, the disks of Examples 1, 2 and 4 have the excellent performance.

On the other hand, in Comparative Example 1 in which soaked in a solvent alone, BLER becomes outside the specification and, in Comparative Example 2, BLER is worse.

The present invention can be carried out in various other forms without departing from the spirit and main features thereof. Therefore, the foregoing Examples are merely illustration in any respect and not to be construed limit the present invention. Further, modifications equivalently belonging to claims are all within the scope of the present invention.

Industrial Applicability

According to the present spin coating method, as described above, not only the crystal deposition at a nozzle tip in waiting can be suppressed but also the occurrence of the coating nonuniformity on a substrate can be suppressed because the change in the composition and the concentration in a coating solution immediately after initiation of re-dropping is very small. Therefore, the present method is particularly useful, for example, when a solution containing a light-absorbing dye having high crystallizability for forming a recording layer of an optical disk is coated.

Further, according to the present method, even when solutes and solvents contained in a coating solution is high cost, since an amount of a nozzle soaking solution used is small, it dose not lead to the increase in cost, being also excellent from a economic point of view

What is claimed is:

1. A spin coating method in producing an optical disc, forming a thin film on a surface of an optical disc by dropping a coating solution having a coating solution composition of at least one solute and a solvent through discharge nozzle tip of the discharge nozzle onto the surface of the optical disc to be coated, mounted on a horizontal turn table and turning the optical disc, said method comprising the steps of:

providing a container having an opening sized and adapted to receive the discharge nozzle tip and a liquid nozzle soaking solution contained in the container, the liquid nozzle soaking solution having a nozzle soaking solution composition of either the at least one solute and the solvent contained in the coating solution or the at least one solute and a different solvent having a similar chemical structure of the solvent contained in the coating solution, the at least one solute in the liquid nozzle soaking solution having a concentration of approximately 10% to 200% of the concentration of at least one solute in the coating solution; and soaking and holding the discharge nozzle tip in the liquid nozzle soaking solution.

2. The spin coating method in producing an optical disc according to claim 1, wherein the coating solution contains a light-absorbing dye as a solute main component.

3. A spin coating method in producing an optical disc, forming a thin film on a surface of an optical disc by dropping a coating solution through a nozzle tip of a discharge nozzle onto the surface of the optical disc to be coated which is mounted on a horizontal turn table and turning the optical disc, the coating solution having a coating solution composition of at least one solute and a solvent, the method comprising the steps of:

providing a container and a liquid nozzle soaking solution contained in the container, the liquid nozzle soaking solution having a nozzle soaking solution composition of either the at least one solute and the solvent contained in the coating solution or the at least one solute and a different solvent having a similar chemical structure of the solvent contained in the coating solution, the at least one solute in the liquid nozzle soaking solution having a concentration of approximately 10% to 200% of the concentration of the at least one solute in the coating solution;

moving the discharge nozzle away from the horizontal turn table after dropping the coating solution onto the surface of the optical disc into a soak-ready position above the container containing the liquid nozzle soaking solution;

moving the container towards the discharge nozzle, the container having an opening sized and adapted to receive at least the nozzle tip; and stopping movement of the container in a soak position when the nozzle tip is immersed in the liquid nozzle soaking solution.

4. A spin coating method in producing an optical disc, forming a thin film on a surface of an optical disc by dropping a coating solution having a coating solution composition of at least one solute and a solvent through discharge nozzle tip of the discharge nozzle onto the surface of the optical disc to be coated, mounted on a horizontal turn table and turning the optical disc, said method comprising the steps of:

providing a container having an opening sized and adapted to receive the discharge nozzle tip and a liquid nozzle soaking solution contained in the container, the liquid nozzle soaking solution having a nozzle soaking solution composition of either the at least one solute and the solvent contained in the coating solution or the at least one solute and a different solvent having a similar chemical structure of the solvent contained in the coating solution, the at least one solute in the liquid nozzle soaking solution having a 100% concentration of the concentration of the at least one solute in the coating solution; and soaking and holding the discharge nozzle tip in the liquid nozzle soaking solution.

* * * * *